(12) United States Patent
Choi

(10) Patent No.: US 9,654,018 B2
(45) Date of Patent: May 16, 2017

(54) DEVIATION COMPENSATION METHOD OF POTENTIAL TRANSFORMER

(71) Applicant: LSIS CO., LTD., Anyang-si, Gyeonggi-do (KR)

(72) Inventor: Yong Kil Choi, Gunpo-si (KR)

(73) Assignee: LSIS CO., LTD., Anyang-si (KR)

( * ) Notice: Subject to any disclaimer, the term of this patent is extended or adjusted under 35 U.S.C. 154(b) by 47 days.

(21) Appl. No.: 14/696,103

(22) Filed: Apr. 24, 2015

(65) Prior Publication Data

US 2015/0333653 A1 Nov. 19, 2015

(30) Foreign Application Priority Data

May 13, 2014 (KR) .................. 10-2014-0057360

(51) Int. Cl.
*H02M 5/458* (2006.01)
*G01R 35/02* (2006.01)
*G01R 19/12* (2006.01)
*H01F 27/42* (2006.01)
*H02P 13/00* (2006.01)

(52) U.S. Cl.
CPC ............ *H02M 5/458* (2013.01); *G01R 19/12* (2013.01); *G01R 35/02* (2013.01); *H01F 27/425* (2013.01); *H02P 13/00* (2013.01)

(58) Field of Classification Search
CPC ........ H02M 5/005; H02M 5/447; H02M 5/45; H02M 5/458; H02M 5/4585; H02M 1/12; H02M 1/0061; H02M 7/7575; H02J 3/01; Y02B 70/126
USPC ..................................... 363/34–40
See application file for complete search history.

(56) References Cited

U.S. PATENT DOCUMENTS

| 5,184,289 A | 2/1993 | Bonnet et al. |
| 6,429,637 B1 * | 8/2002 | Gandhi .............. G01R 21/133 324/142 |
| 2003/0167138 A1 | 9/2003 | Wimmer |

(Continued)

FOREIGN PATENT DOCUMENTS

| CN | 101258671 | 9/2008 |
| CN | 103081346 | 5/2013 |

(Continued)

OTHER PUBLICATIONS

European Patent Office Application Serial No. 15165619.6, Search Report dated Oct. 8, 2015, 7 pages.

(Continued)

*Primary Examiner* — Yemane Mehari
(74) *Attorney, Agent, or Firm* — Lee, Hong, Degerman, Kang & Waimey

(57) ABSTRACT

A deviation compensation method of a potential transformer is provided. The deviation compensation method includes: detecting an output voltage value of a first potential transformer; checking a compensation value applied to the first potential transformer; compensating for the output voltage value based on the compensation value to measure an actual voltage value for a location at which the first potential transformer is installed; verifying the validity of the measured actual voltage value; and resetting a deviation compensator measuring the actual voltage value according to a result of verification on the validity of the actual voltage value.

8 Claims, 13 Drawing Sheets

(56) References Cited

U.S. PATENT DOCUMENTS

| | | | |
|---|---|---|---|
| 2005/0240362 A1 | 10/2005 | Randall | |
| 2006/0085144 A1* | 4/2006 | Slota | G01R 35/04 702/57 |
| 2006/0155511 A1* | 7/2006 | Steinmueller | G01D 3/08 702/176 |
| 2008/0252142 A1 | 10/2008 | Davies et al. | |
| 2011/0148431 A1* | 6/2011 | Satou | G01R 31/027 324/547 |

FOREIGN PATENT DOCUMENTS

| | | |
|---|---|---|
| JP | 60236017 | 11/1985 |
| JP | 63302732 | 9/1988 |
| JP | 2001052941 | 2/2001 |
| JP | 2001218359 | 8/2001 |
| JP | 2003324838 | 11/2003 |
| JP | 2004132937 | 4/2004 |
| JP | 2009507463 | 2/2009 |
| JP | 2009254093 | 10/2009 |
| JP | 2010154679 | 7/2010 |
| JP | 2012080712 | 4/2012 |
| JP | 2012235628 | 11/2012 |
| JP | 2013106359 | 5/2013 |
| JP | 2013135129 | 7/2013 |
| JP | 2014064405 | 4/2014 |
| JP | 2015220459 | 12/2015 |
| JP | 2015220461 | 12/2015 |
| JP | 6027181 | 11/2016 |
| KR | 10-2010-0117788 | 11/2010 |
| KR | 10-1307098 | 9/2013 |
| KR | 10-2014-0005392 | 1/2014 |
| WO | 2012012514 | 1/2012 |

OTHER PUBLICATIONS

Korean Intellectual Property Office Application Serial No. 10-2014-0057360, Notice of Allowance dated May 13, 2015, 2 pages.

Japan Patent Office Application No. 2015-096281, Office Action dated Jun. 7, 2016, 2 pages.

State Intellectual Property Office of the People's Republic of China Application Serial No. 201510239906.3, Office Action dated Mar. 8, 2017, 5 pages.

Japan Patent Office Application No. 2015-096281, Notice of Allowance dated Feb. 21, 2017, 4 pages.

* cited by examiner

DEVIATION COMPENSATION METHOD OF POTENTIAL TRANSFORMER

CROSS-REFERENCE TO RELATED APPLICATIONS

Pursuant to 35 U.S.C. §119(a), this application claims the benefit of earlier filing date and right of priority to Korean Patent Application No. 10-2014-0057360, filed May 13, 2014, the contents of which are hereby incorporated by reference herein in its entirety.

BACKGROUND

The present disclosure relates to a potential transformer, and more particularly, to a deviation compensation method of a potential transformer capable of compensating for the deviation of voltage values measured through a plurality of transformers installed in a high voltage direct current (HVDC) transmission system.

High voltage direct current (HVDC) transmission indicates converting alternating current (AC) power produced at a power station into DC power by a transmission site to transmit the DC power, and then re-converting the DC power into the AC power by a reception site to supplying the AC power.

An HVDC transmission system is applied to submarine cable power transmission, large-amount long-distance power transmission, interconnection between AC systems, etc. Also, the HVDC transmission system enables different frequency systems interconnection and asynchronism interconnection.

The transmission site converts the AC power into the DC power. That is, since transmitting the AC power by using a submarine cable is significantly dangerous, the transmission site converts the AC power into the DC power to transmit the DC power to the reception site.

There are many types of voltage source inverters used in the HVDC transmission system, and a modular multi-level voltage source converter is recently receiving attention most remarkably.

A modular multi-level converter (MMC) is a device converting DC power into AC power by using a plurality of sub modules and operates by allowing each of the sub modules to have a charging, discharging and bypass state.

The potential transformers are installed at many locations in the HVDC transmission system for the purpose of system control and system protection.

However, the potential transformers may have an error of measurement because they measure different measurement values according to a voltage measurement range even when they are the same product, which is recognized as a system fault and thus there may be a need to stop system operation in a serious case.

That is, the voltage measurement error of a single potential transformer generally needs to have a range of about 0.2% to about 0.5%. However, a potential transformer applied to the HVDC transmission system experiences a significant increase in an error range when measuring a high voltage, and when a plurality of potential transformers are installed at many locations, the error range caused by the error of measurement that each potential transformer has, has no choice but to increase.

To this end, it is also possible to use a more precise sensing device, but there are limitations in installation cost and technology in order to use the more precise sensing device.

SUMMARY

Embodiments provide a deviation compensation method of a potential transformer that may compensate for the deviation of voltage values measured at a plurality of potential transformers.

Embodiments also provide a deviation compensation method of a potential transformer that may prevent emergency due to an error in compensation value applied to a plurality of potential transformers.

Technical tasks to be achieved by proposed embodiments are not limited to the above-mentioned technical tasks and other technical tasks not mentioned will be able to be clearly understood by a person skilled in the art from the following descriptions.

In one embodiment, a deviation compensation method of a potential transformer includes: detecting an output voltage value of a first potential transformer; checking a compensation value applied to the first potential transformer; compensating for the output voltage value based on the compensation value to measure an actual voltage value for a location at which the first potential transformer is installed; verifying the validity of the measured actual voltage value; and resetting a deviation compensator measuring the actual voltage value according to a result of verification on the validity of the actual voltage value.

The deviation compensation method may further include determining compensation values to be applied respectively to the first to Nth potential transformers based on the measurement deviation of the first to Nth potential transformers respectively installed at different locations in a high voltage direct current (HVDC) transmission system.

The determination of the compensation values may include: supplying the same first voltage to the first to Nth potential transformers; measuring voltage values output through the first to Nth transformers by the first voltage supplied; determining whether there is a deviation between the measured voltage values; and determining compensation values for correcting the measured voltage values to the same voltage value when there is the deviation.

The first to Nth potential transformers may be connected to a single deviation compensator in common, and the voltage values output through the first to Nth potential transformers may be measured through the deviation compensator.

The compensation values may be values for standardizing the measured voltage values based on at least any one of the average value of the measured voltage values output through the first to Nth potential transformers and the first voltage supplied to the first to Nth potential transformers.

Voltages belonging to the voltage ranges divided into a plurality of sections may be sequentially supplied to the first to Nth potential transformer, and the compensation values may be determined with respect to the voltage range of each section sequentially supplied.

The compensation values may be at least any one of a transformation ratio, offset and gain values to be applied to the first to Nth potential transformers.

The verifying of the validity may include: calculating the difference between a first actual voltage value previously measured for a location at which the first potential transformer is installed, and a second actual voltage value currently measured for a location at which the first potential transformer is installed, determining whether the difference exceeds a preset reference range, determining that the second actual voltage value is valid, when the difference is within the reference range, and determining that the second actual voltage value has an error, when the difference exceeds the reference range.

The deviation compensation method may further include verifying the validity of a third actual voltage value for a location at which the first potential transformer is installed, the third actual voltage value being re-measured after the resetting of the deviation compensator, and outputting a signal requesting for the replacement of the first potential transformer or a signal requesting the re-determination of the compensation value applied to the first potential transformer when the third actual voltage value is invalid.

According to embodiments, it is possible to enhance the reliability of an HVDC transmission system by compensating for the measurement deviation between the potential transformers installed at different locations in the HVDC transmission system.

Also, according to embodiments, it is possible to compensate for the deviation of a plurality of potential transformers by using the same deviation compensator, thus it is possible to remove the deviation of measured voltage values of the plurality of potential transformers by a measuring device, it is easy to control the HVDC transmission system, and it is possible to perform accurate operations, such as voltage deviation protection.

Also, according to embodiments, the HVDC transmission system transmitting power may minimize a loss caused by a measurement deviation and thus it is possible to decrease a system loss.

Also, according to embodiments, when a specific potential transformer has a fault and thus needs to be replaced, it is possible to easily replace the specific potential transformer because information used previously for compensating for the deviation of the plurality of potential transformers has been stored.

The details of one or more embodiments are set forth in the accompanying drawings and the description below. Other features will be apparent from the description and drawings, and from the claims.

DETAILED DESCRIPTION OF THE EMBODIMENTS

Figure 1:
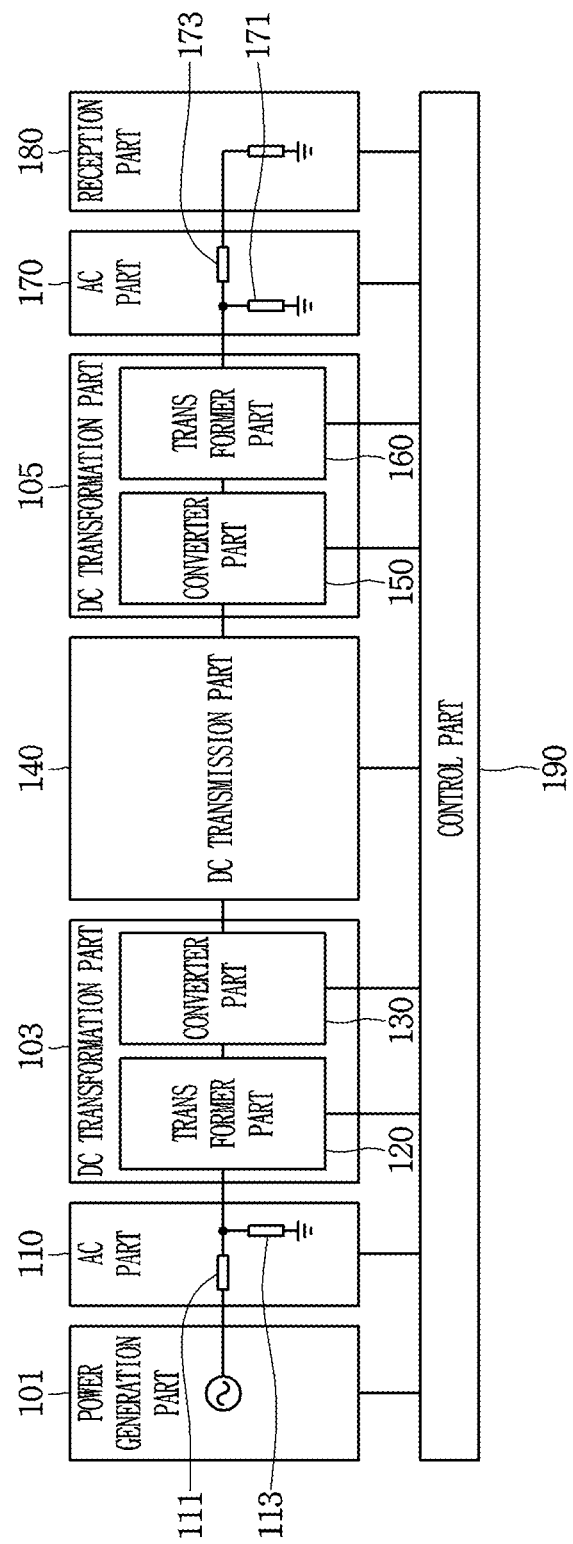
FIG. 1 is a diagram for explaining the configuration of a high voltage direct current (HVDC) transmission system according to an embodiment.

Some embodiments are described below in more detail with reference to the accompanying drawings. In the following description, since the suffixes "module" and "unit" for components are given and interchanged for easiness in making the present disclosure, they do not have distinct meanings or functions.

The effects and features of the inventive concept, and implementation methods thereof will be clarified through following embodiments described with reference to the accompanying drawings. An embodiment may, however, be embodied in different forms and the inventive concept should not be construed as limited to the embodiments set forth herein. Rather, these embodiments are provided to make this disclosure thorough and complete and fully convey the scope of the inventive concept to a person skilled in the art. Further, the inventive concept is only defined by scopes of claims. The same reference numerals throughout the disclosure refer to the same components.

When describing embodiments, detailed descriptions related to known functions or configurations will be ruled out in order not to unnecessarily obscure subject matters of the embodiments. In addition, since the terms used herein are defined in consideration of functions in the embodiments, they may vary depending on a user's, operator's intention or practice. Therefore, the definitions need to be made based on details throughout the inventive concept.

Combinations of each block of the accompanying drawings and each step of a flowchart may also be performed by computer program instructions. Since the computer program instructions may be loaded on the processor of a general-purpose computer, a special-purpose computer or other programmable data processing equipment, the instructions performed by the processor of the computer or other programmable data processing equipment create a means that performs functions described on each block of a drawing or each step of a flowchart. Since the computer program instructions may also be stored in a computer usable or computer readable memory that may aim at the computer or other programmable data processing equipment in order to implement functions in a specific manner, the instructions stored in the computer usable or computer readable memory may also produce an item that includes an instruction means performing functions described on each block of a drawing or each step of a flowchart. The computer program instructions may also be loaded on the computer or other programmable data processing equipment. Thus, since a series of operation steps are performed on the computer or other programmable data processing equipment to create processes executed by a computer, instructions operating the computer or other programmable data processing equipment may also provide steps for performing functions described on each block of a drawing and each step of a flowchart.

Also, each block or each step may represent a portion of a module, a segment or a code that includes one or more executable instructions for performing specific logical function(s). Also, it should be noted that some alternatives may be performed in such a way that functions mentioned at blocks or steps are performed in a different order. For example, two blocks or steps shown one after another may also be performed substantially at the same time or the blocks or steps may also be sometimes performed in a reverse order according to a corresponding function.

FIG. 1 shows a high voltage direct current (HVDC) transmission system according to an embodiment.

As shown in FIG. 1, an HVDC transmission system 100 according to an embodiment includes a power generation part 101, a transmission-side alternating current (AC) part 110, a transmission-side transformation part 103, a DC transmission part 140, a reception-side transformation part 105, a reception-side AC part 170, a reception part 180, and a control part 190. The transmission-side transformation part 103 includes a transmission-side transformer part 120, and a transmission-side AC/DC converter part 130. The reception-side transformation part 105 includes a reception-side DC/AC converter part 150, and a reception-side transformer part 160.

The power generation part 101 generates three-phase AC power. The power generation part 101 may include a plurality of power stations.

The transmission-side AC part 110 transmits the three-phase AC power generated by the power generation part 101 to a DC substation that includes the transmission-side transformer part 120 and the transmission-side AC/DC converter part 130.

The transmission-side transformer part 120 isolates the transmission-side AC part 110 from the transmission-side AC/DC converter part 130 and the DC transmission part 140.

The transmission-side AC/DC converter part 130 converts, into AC power, three-phase AC power corresponding to the output of the transmission-side transformer part 120.

The DC transmission part 140 transmits transmission-side DC power to a reception side.

The reception-side DC/AC converter part 150 converts DC power transmitted by the DC transmission part 140, into three-phase AC power.

The reception-side transformer part 160 isolates the reception-side AC part 170 from the reception-side DC/AC converter part 150 and the DC transmission part 140.

The reception-side AC part 170 provides, to the reception part 180, three-phase AC power corresponding to the output of the reception-side transformer part 160.

The control part 190 controls at least one of the power generation part 101, the transmission-side AC part 110, the transmission-side transformation part 103, the DC transmission part 140, the reception-side transformation part 105, the reception-side AC part 170, the reception part 180, the control part 190, the transmission-side AC/DC converter part 130, and the reception-side DC/AC converter part 150. In particular, the control part 190 may control the turn-on and turn-off timings of a plurality of valves in the transmission-side AC/DC converter part 130 and the reception-side AC/DC converter part 150. In this case, the valve may correspond to a thyristor or insulated gate bipolar transistor (IGBT).

Figure 2:
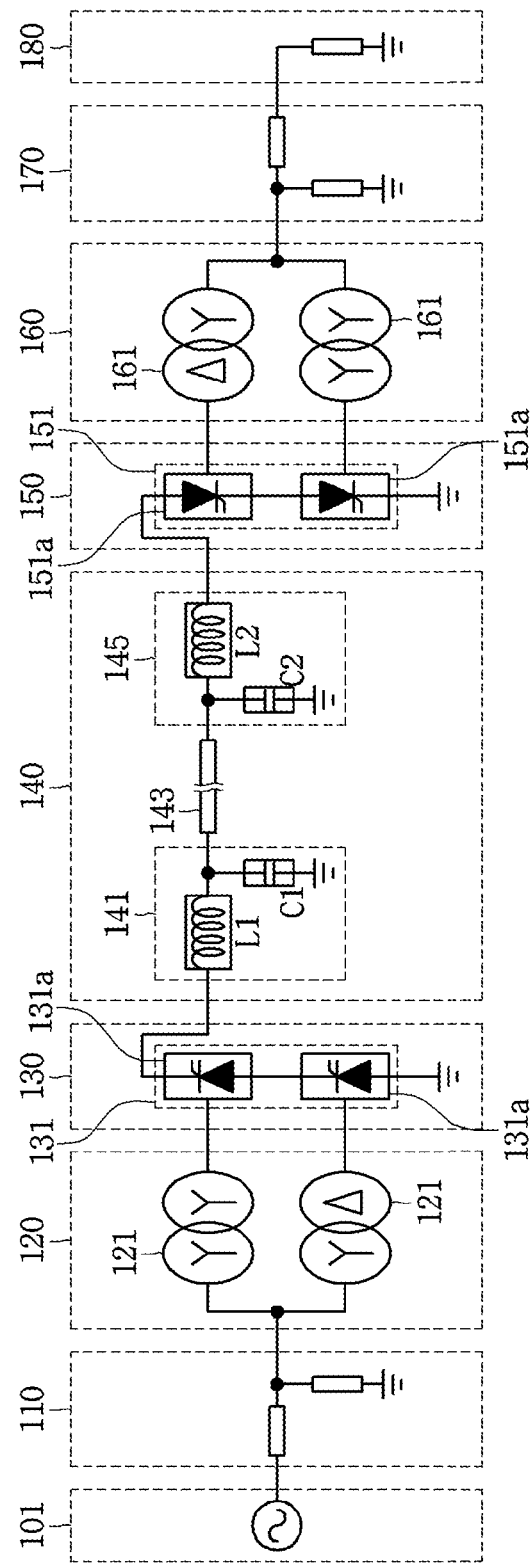
FIG. 2 is a diagram for explaining the configuration of a mono-polar HVDC transmission system according to an embodiment.

FIG. 2 shows a mono-polar HVDC transmission system according to an embodiment.

In particular, FIG. 2 shows a system transmitting single pole DC power. Although it is assumed in the following description that the single pole is a positive pole, there is no need to be limited thereto.

The transmission-side AC part 110 includes an AC transmission line 111 and an AC filter 113.

The AC transmission line 111 transmits three-phase AC power generated by the power generation part 101, to the transmission-side transformation part 103.

The AC filter 113 removes other frequency components excluding frequency components used by the transformation part 103, from the transmitted three-phase AC power.

The transmission-side transformer part 120 includes one or more transformers 121 for the positive pole. For the positive pole, the transmission-side AC/DC converter part 130 includes an AC/positive-pole DC converter 131 generating positive-pole DC power, and the AC/positive-pole DC converter 131 includes one or more three-phase valve bridges 131a corresponding to the one or more transformers 121, respectively.

When one three-phase valve bridge 131a is used, the AC/positive-pole DC converter 131 may use AC power to generate positive-pole DC power having six pulses. In this case, the primary and secondary coils of the transformer 121 of the valve bridge may have a Y-Y connection or Y-Δ connection.

When two three-phase valve bridges 131a are used, the AC/positive-pole DC converter 131 may use AC power to generate positive-pole DC power having 12 pulses. In this case, the primary and secondary coils of the transformer 121 of one of the two valve bridges may have a Y-Y connection, and the primary and secondary coils of the transformer 121 of the other of the two valve bridges may have a Y-Δ connection.

When three three-phase valve bridges 131a are used, the AC/positive-pole DC converter 131 may use AC power to generate positive-pole DC power having 18 pulses. The more the number of pulses of the positive-pole DC power, the price of the filter may decrease.

The DC transmission part 140 includes a transmission-side positive-pole DC filter 141, a positive-pole DC transmission line 143, and a reception-side positive-pole DC filter 145. The transmission-side positive-pole DC filter 141 includes an inductor L1 and a capacitor C1 and DC-filters positive-pole DC power output by the AC/positive-pole DC converter 131.

The positive-pole DC transmission line 143 may have a DC line for transmission of positive-pole DC power, and earth may be used as a current feedback path. One or more switches may be disposed on the DC line.

The reception-side positive-pole DC filter 145 includes an inductor L2 and a capacitor C2 and DC-filters positive-pole DC power transmitted through the positive-pole DC transmission line 143.

The reception-side DC/AC converter part 150 includes a positive DC/AC converter 151, which includes one or more three-phase valve bridges 151a.

The reception-side transformer part 160 includes one or more transformers 161 corresponding respectively to one or more three-phase valve bridges 151a for the positive pole.

When one three-phase valve bridge 151a is used, the positive-pole DC/AC converter 151 may use positive-pole DC power to generate AC power having six pulses. In this case, the primary and secondary coils of the transformer 161 of the valve bridge may have a Y-Y connection or Y-Δ connection.

When two three-phase valve bridges 151a are used, the positive-pole DC/AC converter 151 may use positive-pole DC power to generate AC power having 12 pulses. In this case, the primary and secondary coils of the transformer 161 of one of the two valve bridges may have a Y-Y connection, and the primary and secondary coils of the transformer 161 of the other of the two valve bridges may have a Y-Δ connection.

When three three-phase valve bridges 151a are used, the positive-pole DC/AC converter 151 may use positive-pole DC power to generate AC power having 18 pulses. The more the number of pulses of the AC power, the price of the filter may decrease.

The reception-side AC part 170 includes an AC filter 171 and an AC transmission line 173.

The AC filter 171 removes other frequency components excluding the frequency component (e.g., about 60 Hz) used by the reception part 180, from the AC power generated by the reception-side transformation part 105.

The AC transmission line 173 transmits filtered AC power to the reception part 180.

Figure 3:
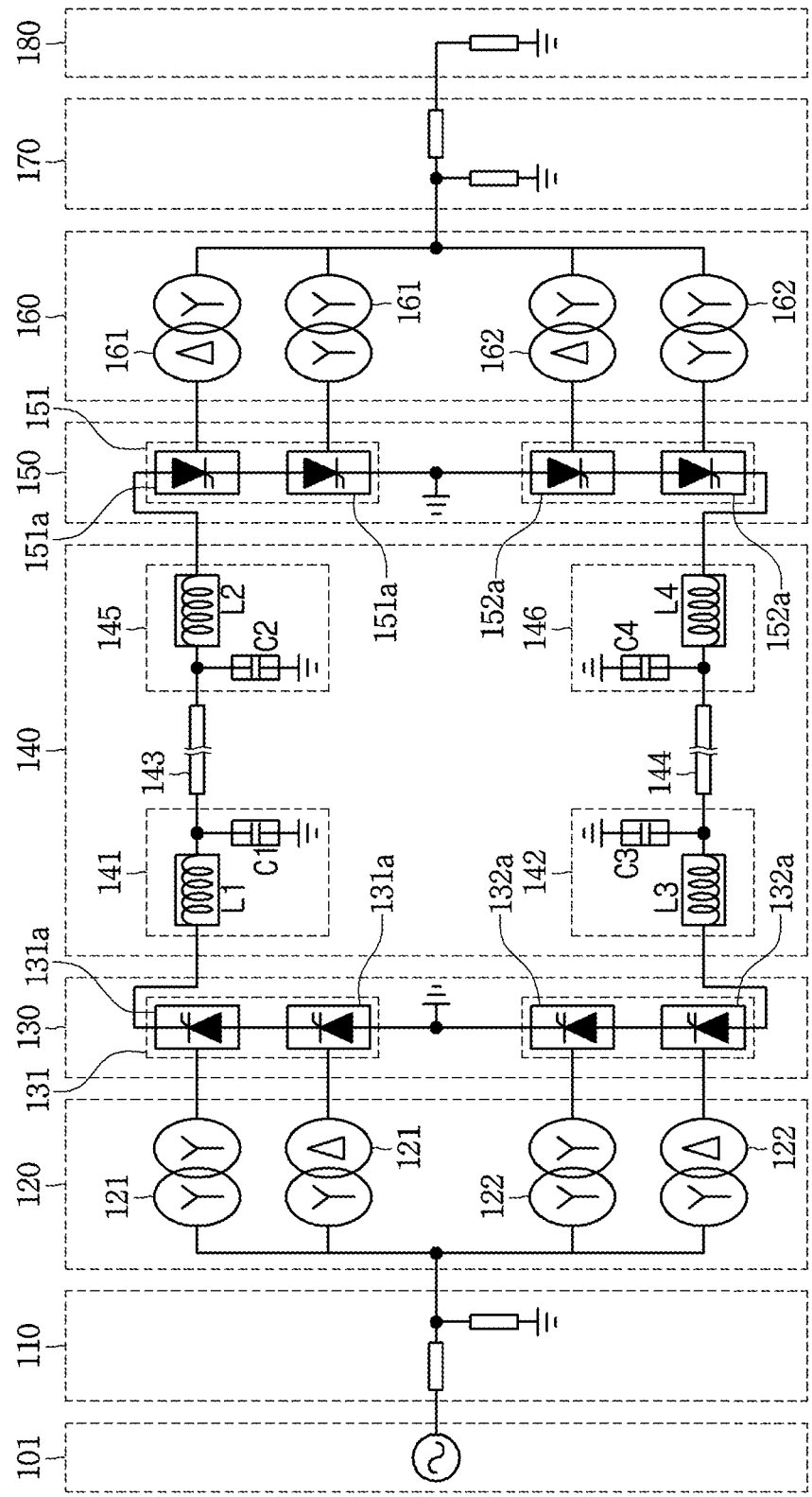
FIG. 3 is a diagram for explaining the configuration of a bipolar HVDC transmission system according to an embodiment.

FIG. 3 shows a bipolar HVDC transmission system according to an embodiment.

In particular, FIG. 3 shows a system transmitting two-pole DC power. Although it is assumed in the following description that the two poles are a positive pole and a negative pole, there is no need to be limited thereto.

A transmission-side AC part 110 includes an AC transmission line 111 and an AC filter 113.

The AC transmission line 111 transmits three-phase AC power generated by a power generation part 101, to a transmission-side transformation part 103.

An AC filter 113 removes other frequency components excluding frequency components used by the transformation part 103, from the transmitted three-phase AC power.

A transmission-side transformer part 120 includes one or more transformers 121 for the positive pole and one or more transformers 122 for the negative pole. A transmission-side AC/DC converter part 130 includes an AC/positive-pole DC converter 131 generating positive-pole DC power and an AC/negative-pole DC converter 132 generating negative-pole DC power, the AC/positive-pole DC converter 131 includes one or more three-phase valve bridges 131a corresponding respectively to one or more transformers 121 for the positive-pole, and the AC/negative-pole DC converter 132 includes one or more three-phase valve bridges 132a corresponding respectively to one or more transformers 122 for the negative-pole.

When one three-phase valve bridge 131a is used for the positive pole, the AC/positive-pole DC converter 131 may use AC power to generate positive-pole DC power having six pulses. In this case, the primary and secondary coils of the transformer 121 of the valve bridge may have a Y-Y connection or Y-Δ connection.

When two three-phase valve bridges 131a are used for the positive pole, the AC/positive-pole DC converter 131 may use AC power to generate positive-pole DC power having 12 pulses. In this case, the primary and secondary coils of the transformer 121 of one of the two valve bridges may have a Y-Y connection, and the primary and secondary coils of the transformer 121 of the other of the two valve bridges may have a Y-Δ connection.

When three three-phase valve bridges 131a are used for the positive pole, the AC/positive-pole DC converter 131 may use AC power to generate positive-pole DC power having 18 pulses. The more the number of pulses of the positive-pole DC power, the price of the filter may decrease.

When one three-phase valve bridge 132a is used for the negative pole, the DC/negative-pole DC converter 132 may generate negative-pole DC power having six pulses. In this case, the primary and secondary coils of the transformer 122 of the valve bridge may have a Y-Y connection or Y-Δ connection.

When two three-phase valve bridges 132a are used for the negative pole, the AC/negative-pole DC converter 132 may generate negative-pole DC power having 12 pulses. In this case, the primary and secondary coils of the transformer 122 of one of the two valve bridges may have a Y-Y connection, and the primary and secondary coils of the transformer 122 of the other of the two valve bridges may have a Y-Δ connection.

When three three-phase valve bridges 132a are used for the negative pole, the AC/negative-pole DC converter 132 may generate negative-pole DC power having 18 pulses. The more the number of pulses of the negative-pole DC power, the price of the filter may decrease.

The DC transmission part 140 includes a transmission-side positive-pole DC filter 141, a transmission-side negative-pole DC filter 142, a positive-pole DC transmission line 143, a negative-pole DC transmission line 144, a reception-side positive-pole DC filter 145, and a reception-side negative-pole DC filter 146.

The transmission-side positive-pole DC filter 141 includes an inductor L1 and a capacitor C1 and DC-filters positive-pole DC power output by the AC/positive-pole DC converter 131.

The transmission-side negative-pole DC filter 142 includes an inductor L3 and a capacitor C3 and DC-filters negative-pole DC power output by the AC/negative-pole DC converter 132.

The positive-pole DC transmission line 143 may have a DC line for transmission of positive-pole DC power, and earth may be used as a current feedback path. One or more switches may be disposed on the DC line.

The negative-pole DC transmission line 144 may have a DC line for transmission of negative-pole DC power, and earth may be used as a current feedback path. One or more switches may be disposed on the DC line.

The reception-side positive-pole DC filter 145 includes an inductor L2 and a capacitor C2 and DC-filters positive-pole DC power transmitted through the positive-pole DC transmission line 143.

The reception-side negative-pole DC filter 146 includes an inductor L4 and a capacitor C4 and DC-filters negative-pole DC power transmitted through the negative-pole DC transmission line 144.

The reception-side DC-AC converter part 150 includes a positive-pole DC/AC converter 151 and a negative-pole DC-AC converter 152, the positive-pole DC/AC converter 151 includes one or more three-phase valve bridges 11a, and the negative-pole DC-AC converter 152 includes one or more three-phase valve bridges 152a.

The reception-side transformer part 160 includes one or more transformers 161 corresponding respectively to one or more three-phase valve bridges 151a for the positive pole and one or more transformers 162 corresponding respectively to one or more three-phase valve bridges 152a for the negative pole.

When one three-phase valve bridge 151a is used for the positive pole, the positive-pole DC/AC converter 151 may use positive-pole DC power to generate AC power having six pulses. In this case, the primary and secondary coils of the transformer 161 of the valve bridge may have a Y-Y connection or Y-Δ connection.

When two three-phase valve bridges 151a are used for the positive pole, the positive-pole DC/AC converter 151 may use positive-pole DC power to generate AC power having 12 pulses. In this case, the primary and secondary coils of the transformer 161 of one of the two valve bridges may have a Y-Y connection, and the primary and secondary coils of the transformer 161 of the other of the two valve bridges may have a Y-Δ connection.

When three three-phase valve bridges 151a are used for the positive pole, the positive-pole DC/AC converter 151 may use positive-pole DC power to generate AC power having 18 pulses. The more the number of pulses of the AC power, the price of the filter may decrease.

When one three-phase valve bridge 152a is used for the negative pole, the negative-pole DC/AC converter 152 may use negative-pole DC power to generate AC power having six pulses. In this case, the primary and secondary coils of the transformer 162 of the valve bridge may have a Y-Y connection or Y-Δ connection.

When two three-phase valve bridges 152a are used for the negative pole, the negative-pole DC/AC converter 152 may use negative-pole DC power to generate AC power having 12 pulses. In this case, the primary and secondary coils of the transformer 162 of one of the two valve bridges may have a Y-Y connection, and the primary and secondary coils of the transformer 162 of the other of the two valve bridges may have a Y-Δ connection.

When three three-phase valve bridges 152a are used for the negative pole, the negative-pole DC/AC converter 152 may use negative-pole DC power to generate AC power having 18 pulses. The more the number of pulses of the AC power, the price of the filter may decrease.

A reception-side AC part 170 includes an AC filter 171 and an AC transmission line 173.

The AC filter 171 removes other frequency components excluding the frequency component (e.g., about 60 Hz) used by the reception part 180, from the AC power generated by the reception-side transformation part 105.

The AC transmission line 173 transmits filtered AC power to the reception part 180.

Figure 4:
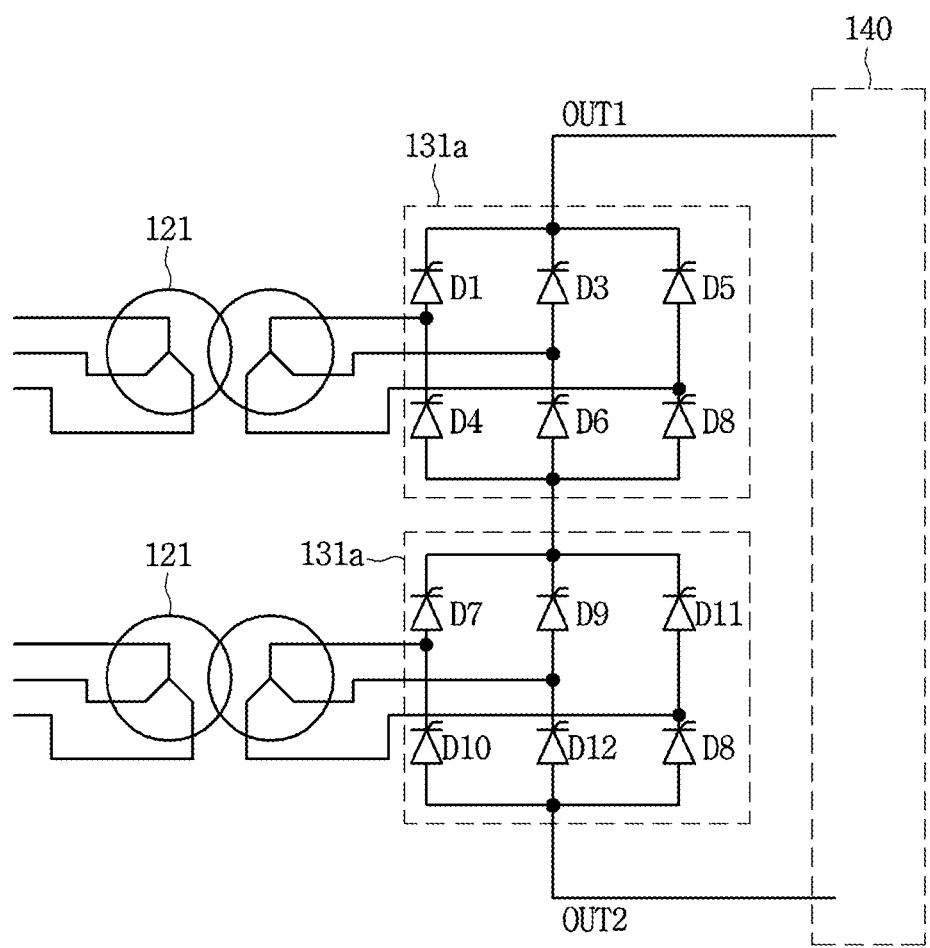
FIG. 4 is a diagram for explaining the connection of a transformer and a three-phase valve bridge according to an embodiment.

FIG. 4 shows the connection of a transformer and a three-phase valve bridge according to an embodiment.

In particular, FIG. 4 shows the connection of two transformers 121 for a positive pole and two three-phase valve bridges 131a for the positive pole. Since the connection of two transformers 122 for a negative pole and two three-phase valve bridges 132a for the negative pole, the connection of two transformers 161 for the positive pole and two three-phase valve bridges 151a for the positive pole, the connection of two transformers 162 for the negative pole and two three-phase valve bridges 152a for the negative pole, the connection of one transformer 121 for the positive pole and one three-phase valve bridge 131a for the positive pole, and the connection of one transformer 161 for the positive pole and one three-phase valve bridge 151a for the positive pole may be easily derived from the embodiment of FIG. 4, related drawings and descriptions are omitted.

In FIG. 4, the transformer 121 having a Y-Y connection is referred to as an upper transformer, the transformer 121 having a Y-Δ connection is referred to as a lower transformer, the three-phase valve bridge 131a connected to the upper transformer is referred to as an upper three-phase valve bridge, and the three-phase valve bridge 131a connected to the lower transformer is referred to as a lower three-phase valve bridge.

The upper three-phase valve bridge and the lower three-phase valve bridge have a first output OUT1 and a second output OUT2 that are two outputs outputting DC power.

The upper three-phase valve bridge includes six valves D1 to D6 and the lower three-phase valve bridge includes six valves D7 to D12.

The valve D1 has a cathode connected to the first output OUT1 and an anode connected to the first terminal of the secondary coil of the upper transformer.

The valve D2 has a cathode connected to the anode of the valve D5 and an anode connected to the anode of the valve D6.

The valve D3 has a cathode connected to the first output OUT1 and an anode connected to the second terminal of the secondary coil of the upper transformer.

The valve D4 has a cathode connected to the anode of the valve D1 and an anode connected to the anode of the valve D6.

The valve D5 has a cathode connected to the first output OUT1 and an anode connected to the third terminal of the secondary coil of the upper transformer.

The valve D6 has a cathode connected to the anode of the valve D3.

The valve D7 has a cathode connected to the anode of the valve D6 and an anode connected to the first terminal of the secondary coil of the lower transformer.

The valve D8 has a cathode connected to the anode of the valve D11 and an anode connected to the second output OUT2.

The valve D9 has a cathode connected to the anode of the valve D6 and an anode connected to the second terminal of the secondary coil of the lower transformer.

The valve D10 has a cathode connected to the anode of the valve D7 and an anode connected to the second output OUT2.

The valve D11 has a cathode connected to the anode of the valve D6 and an anode connected to the third terminal of the secondary coil of the lower transformer.

The valve D12 has a cathode connected to the anode of the valve D9 and an anode connected to the second output OUT2.

The reception-side DC/AC converter part 150 may include a modular multi-level converter 200.

The modular multi-level converter 200 may use a plurality of sub modules 210 to convert DC power into AC power.

The configuration of the modular multi-level converter 200 is described with reference to FIG. 5.

Figure 5:
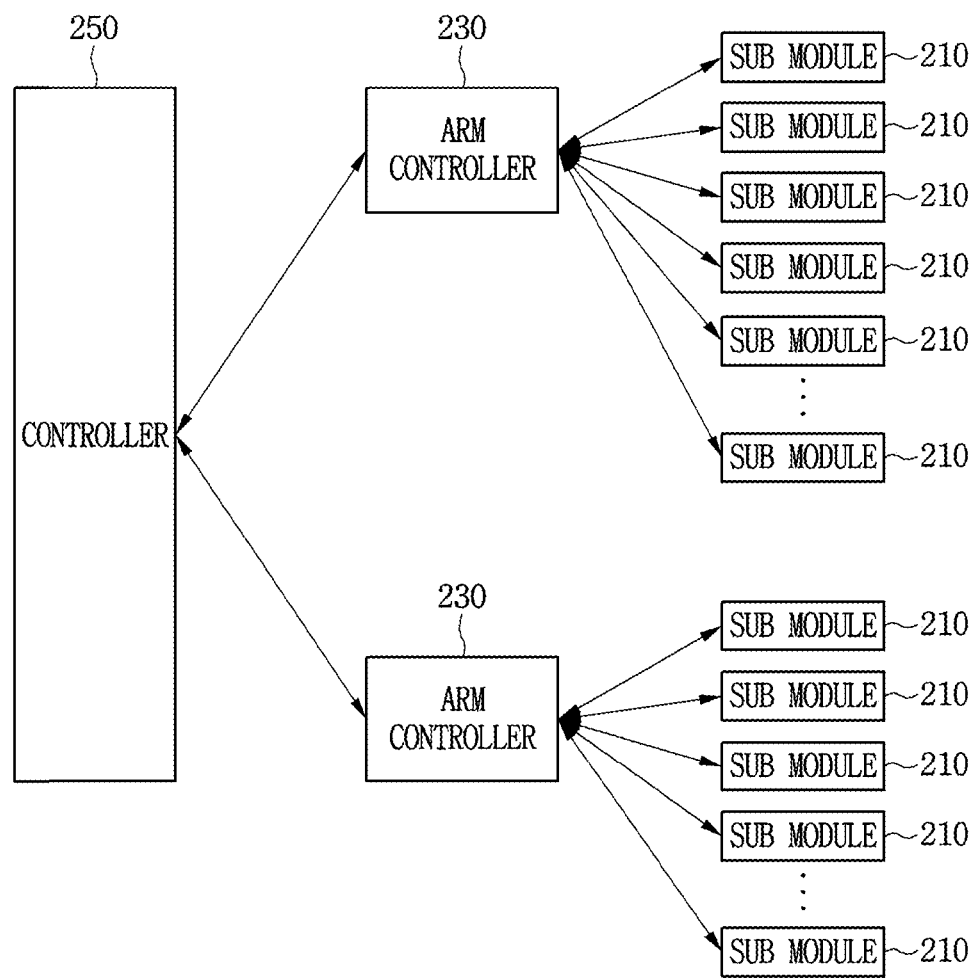
FIG. 5 is a schematic block diagram of a modular multi-level converter according to an embodiment.

FIG. 5 is a block diagram of the modular multi-level converter 200.

The modular multi-level converter 200 includes a controller 250, a plurality of arm controllers 230, and a plurality of sub modules 210.

The controller 250 may control the plurality of arm controllers 230 and each of the arm controllers 230 may control the plurality of sub modules 210.

The configuration of the modular multi-level converter 200 is described in detail with reference to FIG. 6.

Figure 6:
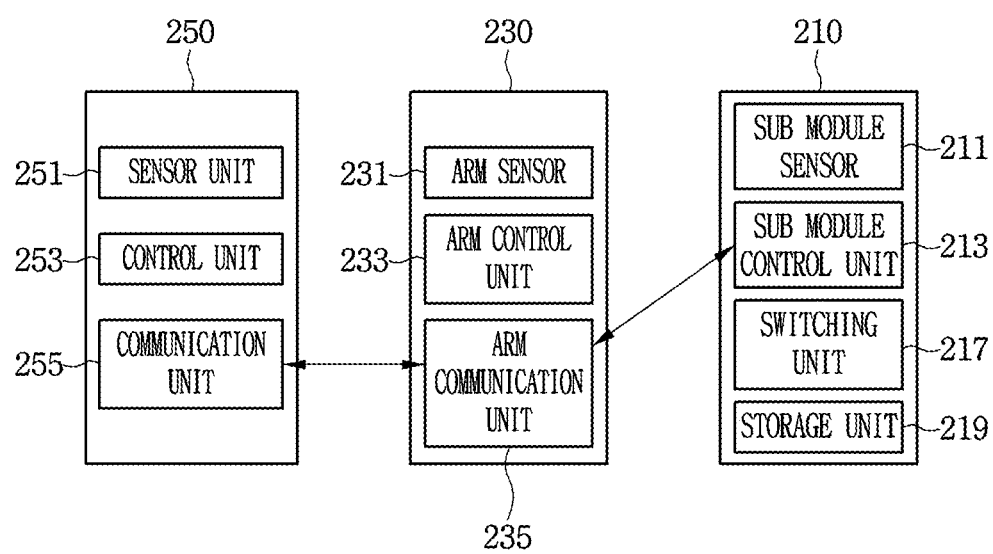
FIG. 6 is a detailed block diagram of a modular multi-level converter according to an embodiment.

FIG. 6 is a block diagram of the modular multi-level converter 200.

The modular multi-level converter 200 includes the sub module 210, the arm controller 230, and the controller 250

The sub module 210 may receive DC power to perform charging, discharging and bypass operations, and includes a sub module sensor 211, a sub module control unit 213, a switching unit 217, and a storage unit 219.

The sub module sensor 211 may measure one or more of the current and voltage of the sub module 210.

The sub module control unit 213 may control the overall operations of the sub module 210.

In particular, the sub module control unit 213 may control the current and voltage measurement operations of the sub module sensor 211 and the switching operation of the switching unit 217.

The switching unit 217 may switch a current input and output from the sub module 210.

The switching unit 217 includes at least one switch and may perform a switching operation according to the control signal of the sub module control unit 213.

Also, the switching unit 217 may include a diode and perform the switching operation and the charging, discharging and bypass operations of the sub module 210 as the rectification operations of the diode.

The storage unit 219 may perform a charging operation in which energy is charged based on a current input to the sub module 210.

Also, the storage unit 219 may operate a discharging operation in which a current is output based on the charged energy.

The connection of the plurality of sub modules 210 included in the modular multi-level converter 200 is described with reference to FIG. 7.

Figure 7:
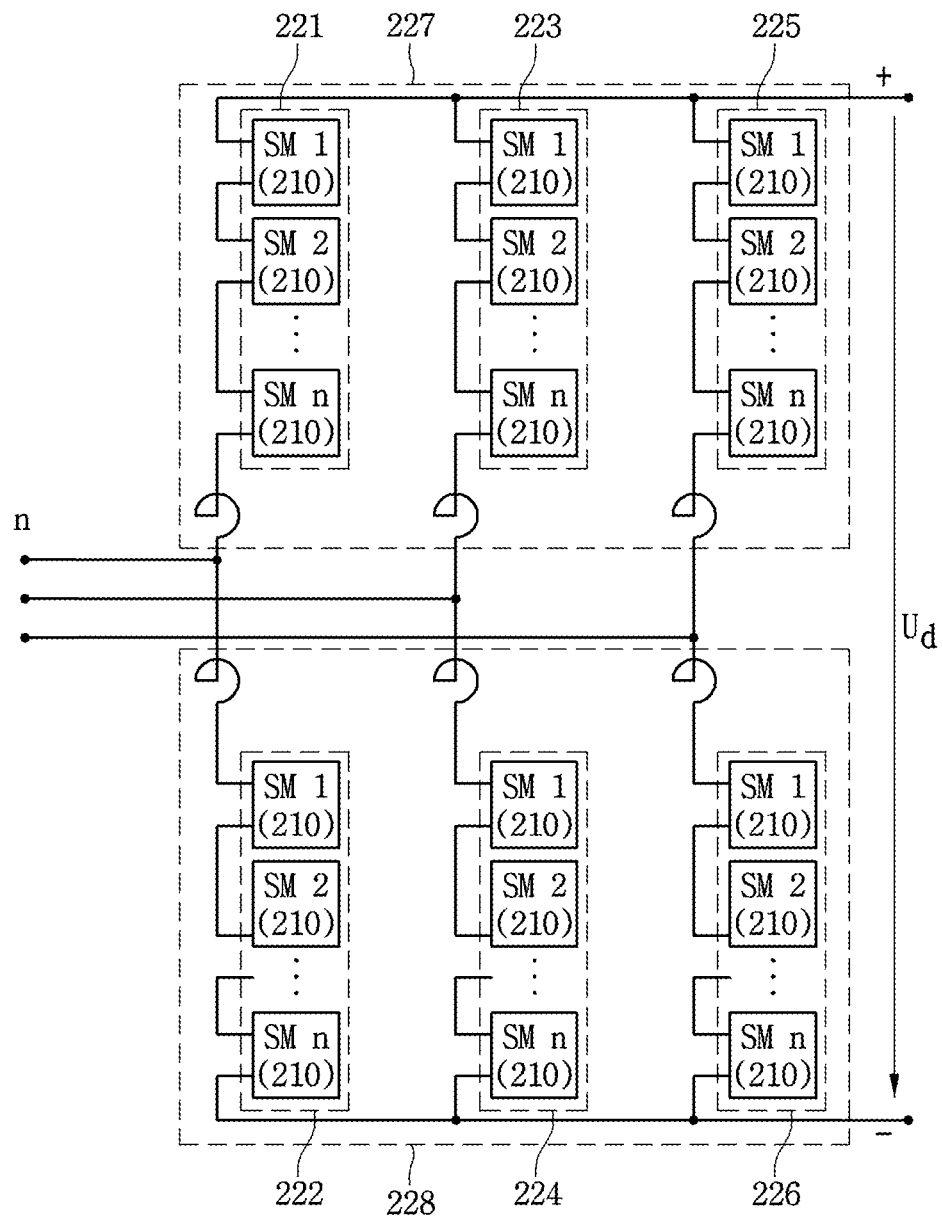
FIG. 7 represents the connection of a plurality of sub modules according to an embodiment.

FIG. 7 represents the connection of the plurality of sub modules 210 included in the modular multi-level converter 200.

Referring to FIG. 7, the plurality of sub modules 210 may be connected in series and the plurality of sub modules 210 connected to a one-phase positive-pole or negative-pole may form an arm. 2

The three-phase modular multi-level converter 200 may generally include six arms, because each of three phases A to C may have a positive pole and a negative pole.

Thus, the three-phase modular multi-level converter 200 may include a first arm 221 including the plurality of sub modules 210 for an A-phase positive-pole, a second arm 222 including the plurality of sub modules 210 for an A-phase negative-pole, a third arm 223 including the plurality of sub modules 210 for an B-phase positive-pole, a fourth arm 224 including the plurality of sub modules 210 for an B-phase negative-pole, a fifth arm 225 including the plurality of sub modules 210 for an C-phase positive-pole, and a sixth arm 226 including the plurality of sub modules 210 for an C-phase negative-pole.

In addition, the plurality of sub modules 210 for a phase may form a leg.

Thus, the three-phase modular multi-level converter 200 may include an A-phase leg 227 including the plurality of sub modules 210 for the A-phase, a B-phase leg 228 including the plurality of sub modules 210 for the B-phase, and a C-phase leg 229 including the plurality of sub modules 210 for the C-phase.

Thus, the first arm 221 to the sixth arm 226 are included in the A- to C-phase legs 227 to 229.

In particular, the A-phase leg 227 includes the first arm 221 being an A-phase positive-pole arm and the second arm 222 being an A-phase negative-pole arm, and the B-phase leg 228 includes the third arm 223 being a B-phase positive arm and the fourth arm 224 being the B-phase negative arm. In addition, the C-phase leg 229 includes the fifth arm 225 being a C-phase positive-pole arm and the sixth arm 226 being a C-phase negative arm.

Also, the plurality of sub modules 210 may form a positive-pole arm 227 and a negative-pole arm 228 according to their polarity.

In particular, referring to FIG. 7, the plurality of sub modules 210 included in the modular multi-level converter 200 may be divided into a plurality of sub modules 210 corresponding to the positive pole and a plurality of sub modules 210 corresponding to the negative pole around a neutral line n.

Thus, the modular multi-level converter 200 may include the positive-pole arm 227 including the plurality of sub modules 210 corresponding to the positive pole and the negative pole 228 including the plurality of sub modules 210 corresponding to the negative pole.

Thus, the positive-pole arm 227 may include the first to third arm 221, the third arm 223, and the fifth arm 225, and the negative arm 228 may include the second arm 222, the fourth arm 224, and the sixth arm 226.

Subsequently, the configuration of the sub module 210 is described with reference to FIG. 8.

Figure 8:
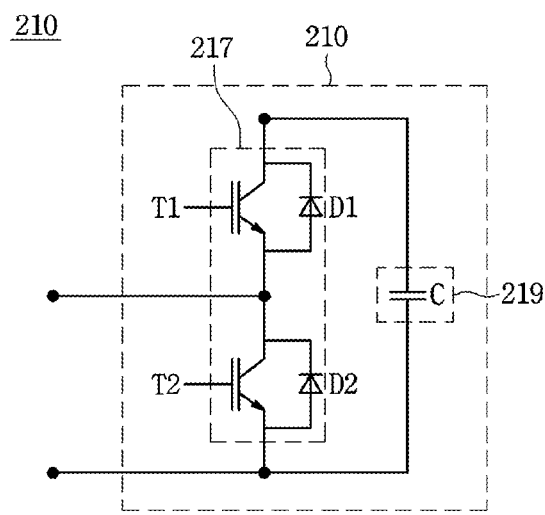
FIG. 8 illustrates the configuration of a sub module according to an embodiment.

FIG. 8 illustrates the configuration of the sub module 210.

Referring to FIG. 8, the sub module 210 includes two switches, two diodes and a capacitor. The sub module 210 of this type is referred to as a half-bridge type or half bridge inverter.

In addition, the switch included in the switching unit 217 may include a power semiconductor.

In this case, the power semiconductor indicates a semiconductor device for a power device and may be optimized for the conversion or control of power. In addition, the power semiconductor is also referred to as a valve device.

Thus, the switch included in the switching unit 217 may include the power semiconductor, e.g., an insulated gate bipolar transistor (IGBT), gate turn-off thyristor (GTO), integrated gate commutated thyristor (IGCT).

The storage unit 219 includes the capacitor and may thus charge and discharge energy.

A plurality of sensors is installed at the HVDC transmission system, such as a modular multi-level converter as described above.

That is, an arm sensor 231 or the sub module sensor 211 is installed at the HVDC transmission system as described above. FIG. 7 depicts that only one arm sensor 231 and only one sub module sensor 211 are installed, which is for the convenience of description, and the arm sensor or the sub module sensor 211 is actually installed in plurality.

In this case, the arm sensor 231 or the sub module sensor 211 may be implemented in a potential transformer. However, since each of potential transformers has different error ranges, different voltage values may be output according to the potential transformer measuring a voltage even when the same voltage is measured.

Thus, the inventive concept compensates for the deviation of the plurality of potential transformers installed at different locations in the HVDC transmission system, as described above.

Figure 9:
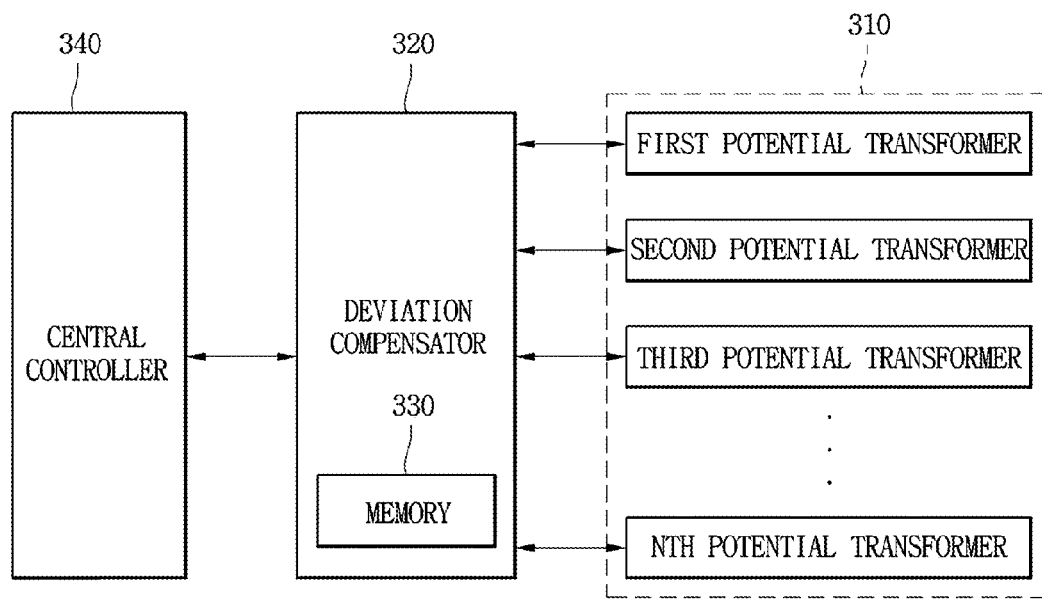
FIG. 9 represents the deviation compensation device of a potential transformer according to an embodiment.

FIG. 9 represents the deviation compensation device of a potential transformer according to an embodiment.

Referring to FIG. 9, the deviation compensation device of the potential transformer includes a plurality of potential transformers 310 installed at different locations in the HVDC transmission system, a deviation compensator 320 measuring voltage values output through the plurality of potential transformers 310, checking the measurement deviation between the plurality of potential transformers 310 by using the measured voltage values, and determining compensation values for compensating the measurement deviation based on the checked measurement deviation, and a central controller 340 receiving the voltage values of the plurality of potential transformers 310 to which the compensation values have been applied through the deviation compensator 320, and determining whether to reset the deviation compensator 320 based on the received voltage values.

The potential transformer 310 may include first to Nth potential transformers.

The first to Nth potential transformers may be manufactured by the same manufacturer or by different manufacturers.

The potential transformers have a deviation in measured voltage value even when the same product is installed at the same location.

The deviation compensator 320 measures the voltage values output through the plurality of potential transformers 310, and when there is a deviation in the measured voltage values, the deviation compensator 320 sets a compensation value for compensating for it.

In this case, the deviation compensator 320 includes a memory 330 for storing the set compensation value when the compensation value for each of the plurality of potential transformers 310 is set.

Also, the deviation compensator 320 uses the determined compensation value to compensate for the voltage values output through the first to Nth potential transformer, and uses the compensated voltage values to measure actual voltage values for respective locations at which the first to Nth potential transformers are installed.

In addition, the deviation compensator 320 transmits the measured actual voltage values to the central controller 340, when the actual voltage values for the locations at which the first to Nth potential transformers are installed are measured.

The central controller 340 uses the actual voltage values transmitted through the deviation compensator 320 to check the voltage values of the locations at which the first to Nth potential transformers are installed, and controls the overall operations of the HVDC transmission system based on the checked voltage values.

In this case, the central controller 340 determines whether the actual voltage values provided through the deviation compensator 320 have errors, based on the voltage values for respective locations at which the first to Nth potential transformers are installed.

For example, due to an error in operation of the deviation compensator 320 or incorrect application of a compensation value, the actual voltage values for the installation locations of the first to Nth potential transformers measured through the deviation compensator 320 may have errors.

In this case, when the HVDC transmission system is controlled by the central controller 340 by using the actual voltage values that have errors, the HVDC transmission system has an error in operation.

Thus, the central controller 340 controls the operation of the HVDC transmission system based on the actual voltage value, in which case since the actual voltage value having the error is provided, it may be wrongly recognized that the HVDC transmission system has a fault and so an alarm is generated or the system stops, even when the HVDC transmission system normally operates.

Thus, the central controller 340 verifies the validity of the actual voltage values for respective locations of the first to Nth potential transformers provided through the deviation compensator 320.

For example, when an actual voltage value for the installation location of the first potential transformer is provided, the central controller 340 compares a first actual voltage value for the installation location of the first potential transformer previously provided with a second actual voltage value for the installation location of the first potential transformer currently provided, and determines whether the difference between the first actual voltage value and the second actual voltage value exceeds a preset reference range.

In addition, when the difference between the first actual voltage value and the second actual voltage value exceeds the preset reference range, the central controller 340 notices that the deviation compensator 320 has an error, and resets the deviation compensator accordingly.

In this case, the error that the deviation compensator 320 has may be eliminated only by the resetting operation of the deviation compensator 320.

Accordingly, the deviation compensator 320 performs the resetting operation in response to the resetting request, and re-transmits the actual voltage values for the installation locations of the first to Nth potential transformers to the central controller 340 when the resetting operation is completed.

In addition, the central controller 340 re-verifies the validity of the re-transmitted actual voltage value.

When the re-verified actual voltage value is valid, the central controller 340 performs the control operation of the HVDC transmission system by using the valid actual voltage value. However, when the re-transmitted actual voltage value is invalid, the central controller 340 notices that a specific potential transformer from which the invalid actual voltage value has been detected has a fault, and accordingly outputs a message requesting for the replacement of the specific potential transformer.

Also, before the central controller 340 requests for the replacement of the specific potential transformer, it first determines whether the compensation value applied to the specific potential transformer has an error and re-determines the compensation value to be applied to the specific potential transformer when the compensation value has the error.

In the following, the operation of the deviation compensation device of the potential transformer is described in more detail with reference to the accompanying drawings.

Figure 10:
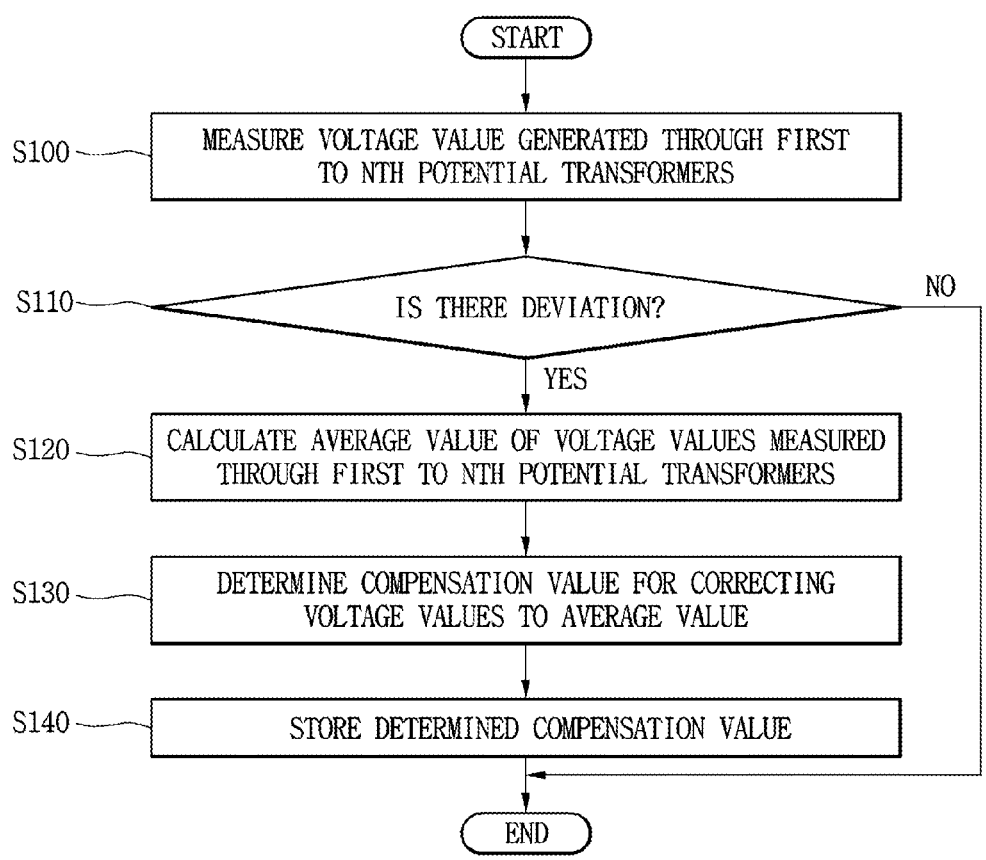
FIG. 10 is a flowchart for explaining, step by step, the deviation compensation method of a potential transformer according to a first embodiment.
Figure 11:
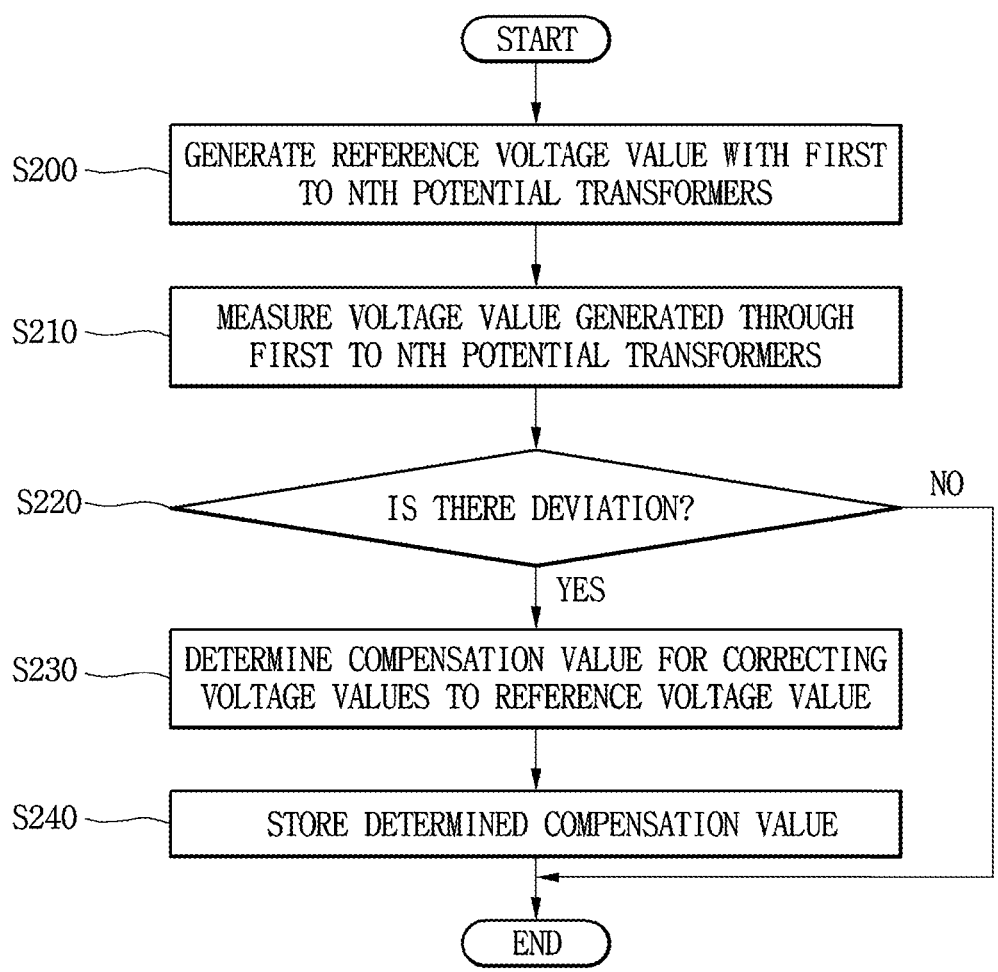
FIG. 11 is a flowchart for explaining, step by step, the deviation compensation method of a potential transformer according to a second embodiment.
Figure 12:
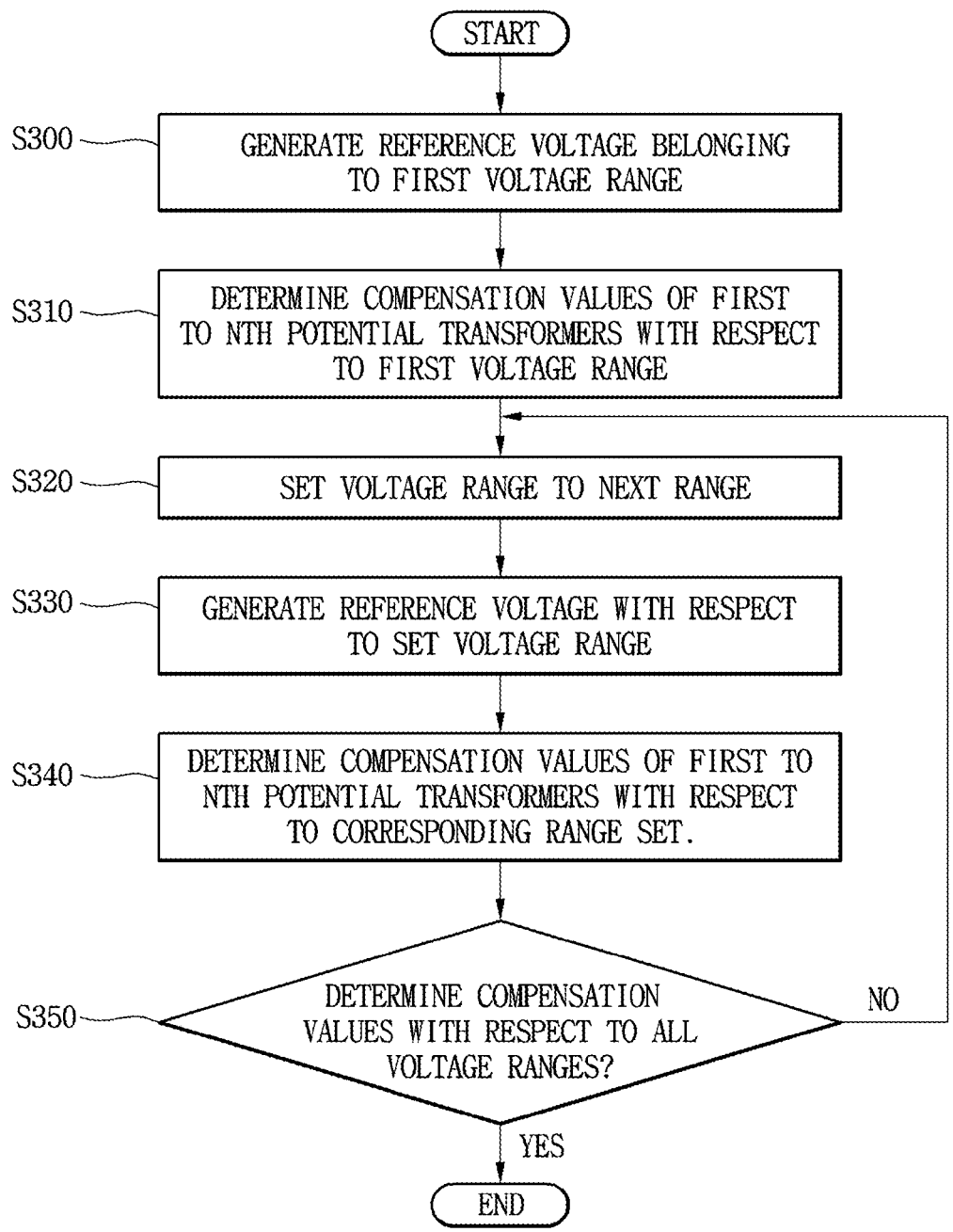
FIG. 12 is a flowchart for explaining, in detail, the compensation value determination process in FIGS. 10 and 11.

FIG. 10 is a flowchart for explaining, step by step, the deviation compensation method of a potential transformer according to a first embodiment, FIG. 11 is a flowchart for explaining, step by step, the deviation compensation method of a potential transformer according to a second embodiment, and FIG. 12 is a flowchart for explaining, in detail, the compensation value determination process in FIGS. 10 and 11.

Firstly, referring to FIG. 10, the deviation compensator 320 measures voltage values generated through the first to Nth potential transformers in step S100. In this case, the same voltage is supplied to the first to Nth potential transformers and accordingly, the first to Nth potential transformers perform a voltage measurement operation on the same voltage supplied.

Also, the first to Nth potential transformers are respectively installed at different locations in an HVDC transmission system, and accordingly, the same voltage is supplied to the first to Nth potential transformers installed at different locations, respectively.

Then, the deviation compensator 320 determines whether there is a deviation between the voltage values generated through the first to Nth potential transformers in step S110. That is, the deviation compensator 320 determines whether the voltage values generated through the first to Nth potential transformers all are the same voltage value or different voltage values.

Subsequently, the deviation compensator 320 calculates the average value of the voltage values generated through the first to Nth potential transformers in step S120 when there is the deviation between the voltage values generated through the first to Nth transformers. In the first embodiment, the average value becomes a reference value and the deviation between the first to Nth potential transformers is compensated for by the reference value.

When the average value is calculated, the deviation compensator 320 determines a compensation value for standardizing, all of the voltage values generated through the first to Nth potential transformers, to the average value in step S130.

In this case, the compensation value is determined to depend on the voltage values generated through the first to Nth potential transformers. For example, when the average value is 4 and the voltage value generating at the first potential transformer is 5, the compensation value may be set to a value, such as '−1'.

Also, since the voltage values generated through the first to Nth potential transformers all have different values, the compensation value of each of the first to Nth potential transformers determined by the average value is determined to be different values.

In this case, the average value may be the average value of the voltage values generated through only specific potential transformers, not the average value of all of the voltage values generated through the first to Nth potential transformers.

For example, when there is a big difference between a specific one of the voltage values generated through the first to Nth potential transformers and other voltage values, the accuracy of the compensation value may decrease when the average value is calculated by including the voltage value having the big difference.

Accordingly, in an embodiment, the average value is calculated by using only specific ones of the voltage values generated through the first to Nth potential transformers and a compensation value for each of the first to Nth potential transformers is determined by using the calculated average value.

Subsequently, the deviation compensator 320 stores a compensation value for each of the first to Nth potential transformers determined, in step S140.

The compensation value is a value for standardizing the voltage measurement characteristic of the first to Nth potential transformers and accordingly, the compensation value may include at least any one of a transformation ratio, offset and gain values.

For example, when a primary voltage value of about 100 V needs to be detected as a secondary voltage value of about 10 V but the secondary voltage value is about 15 V, the compensation value is used to correct the secondary voltage value of about 15 V to the secondary voltage value of about 10 V. In this case, the original voltage change ratio is 100:10 but it is appreciated as 100:15 above and accordingly, when a voltage of about 15 V is detected within a range where a voltage of about 100 V is applied, it is possible to appreciate the primary voltage value as about 100 V. Likewise, it is possible to form the compensation value by using the offset value or gain value, not the voltage change ratio.

Next, referring to FIG. 11, the deviation compensator 320 generates a reference voltage value in step S200.

In addition, the deviation compensator 320 measures the output voltage values of the first to Nth potential transformers measuring the generated reference voltage value in step S210.

Then, the deviation compensator 320 determines whether there is a deviation between the voltage values generated through the first to Nth potential transformers in step S220. That is, the deviation compensator 320 determines whether the voltage values generated through the first to Nth potential transformers all are the same voltage value or different voltage values.

Subsequently, the deviation compensator 320 determines a compensation value for correcting the voltage values generated through the first to Nth potential transformers to the reference voltage value in step S230, when there is the deviation between the voltage values generated through the first to Nth transformers.

In this case, the compensation value is determined to depend on the voltage values generated through the first to Nth potential transformers. For example, when the reference voltage value is 4 and the voltage value generating at the first potential transformer is 5, the compensation value may be set to a value, such as '−1'.

Also, since the voltage values generated through the first to Nth potential transformers all have different values, the compensation value of each of the first to Nth potential transformers determined by the reference voltage value is determined to be different values.

Subsequently, the deviation compensator 320 stores a compensation value for each of the first to Nth potential transformers determined in step S240.

The compensation value is a value for standardizing the voltage measurement characteristic of the first to Nth potential transformers and accordingly, the compensation value may include at least any one of a transformation ratio, offset and gain values.

The compensation value needs to be set depending on a measured voltage section.

For example, the deviation when a voltage of about 100 V is measured may be deferent from the deviation when a voltage of about 200 V is measured.

Thus, the embodiment enables different compensation values to be determined on each of the first to Nth potential transformers according to a measured voltage section.

To this end, referring to FIG. 12, any one of voltage values belonging to a first voltage range (e.g., about 1 V to about 20 V) is firstly generated in step S300.

In addition, the output voltage values of the first to Nth potential transformers by the generated voltage values are measured and compensation values for the first to N potential transformers are respectively determined by using the measured voltage values in step S310. In this case, the determined compensation value is a compensation value for the first voltage range set.

In this case, the compensation value may be determined based on the average value of the voltage values generated through the first to Nth potential transformers or may be otherwise determined based on the generated voltage value belonging to the first voltage range.

Then, the deviation compensator 320 sets a voltage range to the next voltage range in step S320. For example, the deviation compensator 320 may set the voltage range to a second voltage range of about 21 V to about 40 V.

In addition, the deviation compensator 320 generates any one of the voltage values belonging to the next voltage range set in step S330.

Subsequently, the deviation compensator 320 determines a compensation value on the set voltage range based on the generated voltage values in step S340.

Then, the deviation compensator 320 checks whether compensation values for all voltage ranges have been determined, ends if positive, and returns to step S320 to determine compensation values on the next voltage range in step S350 if negative.

The deviation compensator 320 stores a reference value being the basis of determination of the compensation values.

In addition, when any one of the first to Nth potential transformers on which compensation values have been determined has a fault and thus needs to replace it with a new potential transformer, a compensation value for the new potential transformer is determined based on the stored reference value.

Figure 13:
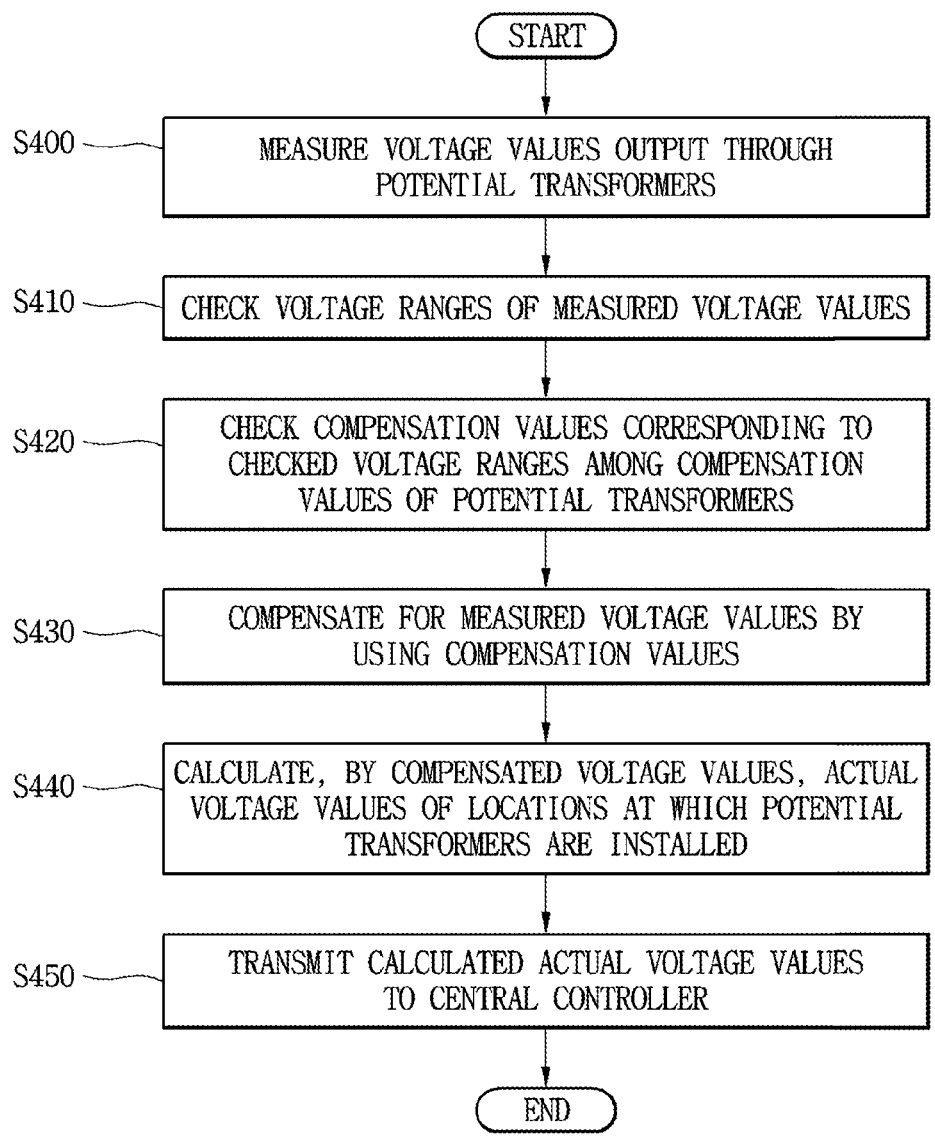
FIG. 13 is a flowchart for explaining, step by step, a voltage measurement method using the compensation value determined by an embodiment.

FIG. 13 is a flowchart for explaining, step by step, a voltage measurement method using the compensation value determined by an embodiment.

The deviation compensator 320 measures a voltage value output through specific ones of the first to Nth potential transformers in step S400.

Subsequently, the deviation compensator 320 checks a voltage range of the measured voltage values in step S410.

In addition, the deviation compensator 320 checks a compensation value corresponding to the checked voltage range among the compensation voltages of the specific potential transformers in step S420.

Subsequently, the deviation compensator 320 applies the checked compensation value to compensate for the voltage value measured through the specific potential transformers in step S430.

In addition, the deviation compensator 320 uses the compensated voltage value to calculate the actual voltage values of locations at which the specific potential transformers in step S440.

Subsequently, the deviation compensator 320 transmits the calculated actual voltage values to a central controller in step S450.

Figure 14:
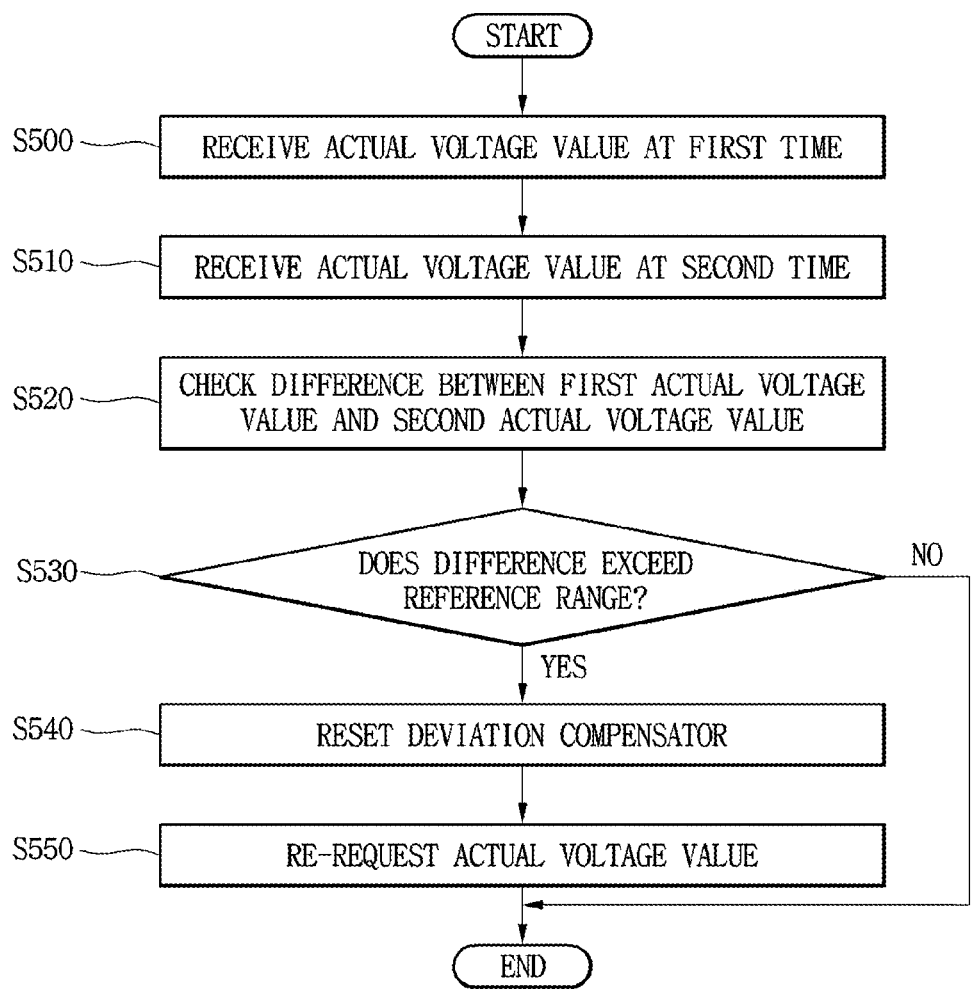
FIG. 14 is a flow chart for explaining, step by step, a method of determining the validity of a measured actual voltage value according to an embodiment.

FIG. 14 is a flow chart for explaining, step by step, a method of determining the validity of a measured actual voltage value according to an embodiment.

Referring to FIG. 14, the central controller 340 receives a first voltage value measured through a specific one of the first to Nth potential transformers at a first time in step S500.

Subsequently, the central controller 340 receives a second actual voltage value measured through the specific potential transformer at a second time after the first time in step S510.

The central controller 340 calculates the difference between the first actual voltage value received and the second actual voltage value received in step S520.

In addition, the central controller 340 determines whether the calculated difference exceeds a preset reference range in step S530.

When as a result of determination in step S530, the calculated difference exceeds the preset reference range, the central controller 340 notices that the deviation compensator 320 compensating for the voltage value has an error and thus resets the deviation compensator 320 in step S540.

Subsequently, the central controller 340 re-requests, from the reset deviation compensator 320, an actual voltage value for the location at which the specific potential transformer has been installed, in step S550.

According to embodiments, it is possible to enhance the reliability of an HVDC transmission system by compensating for the measurement deviation between the potential transformers installed at different locations in the HVDC transmission system.

Also, according to embodiments, it is possible to compensate for the deviation of a plurality of potential transformers by using the same deviation compensator, thus it is possible to remove the deviation of measured voltage values of the plurality of potential transformers, it is easy to control the HVDC transmission system, and it is possible to perform accurate operations, such as voltage deviation protection.

Also, according to embodiments, the HVDC transmission system transmitting power may minimize a loss caused by a measurement deviation and thus it is possible to decrease a system loss.

Also, according to embodiments, when a specific potential transformer has a fault and thus needs to be replaced, it is possible to easily replace the specific potential transformer because information used previously for compensating for the deviation of the plurality of potential transformers has been stored.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A deviation compensation method for a potential transformer, the method comprising:
   detecting an output voltage value of a first potential transformer;
   determining a compensation value applied to the first potential transformer;
   compensating the output voltage value based on the compensation value in order to measure an actual voltage value for a location at which the first potential transformer is installed;
   verifying validity of the measured actual voltage value; and
   resetting a deviation compensator by measuring the actual voltage value according to the verified validity,
   wherein verifying the validity comprises:
   calculating a difference between a previously measured actual voltage value the location at which the first potential transformer is installed and a currently measured actual voltage value for the location at which the first potential transformer is installed;
   determining whether the calculated difference exceeds a preset reference range;
   determining that the currently measured actual voltage value is valid when the difference is within the reference range;
   determining that the currently measured actual voltage value has an error when the difference exceeds the reference range.

2. The deviation compensation method according to claim 1, further comprising determining compensation values to be applied to each of first to Nth potential transformers based on measurement deviation of the first to Nth potential transformers installed at different locations in a high voltage direct current transmission system.

3. The deviation compensation method according to claim 2, wherein determining the compensation values comprises:
   supplying a same voltage to the first to Nth potential transformers;
   measuring voltage values output via each of the first to Nth transformers when the first voltage is supplied;

determining whether there is deviation between the measured voltage values; and determining compensation values for correcting the measured voltage values when there is deviation.

4. The deviation compensation method according to claim 3, wherein:

each of the first to Nth potential transformers is connected to a single deviation compensator in common; and the voltage values output via each of the first to Nth potential transformers are measured via the single deviation compensator.

5. The deviation compensation method according to claim 3, wherein the compensation values are for standardizing the measured voltage values based on at least an average value of the measured voltage values or the supplied voltage.

6. The deviation compensation method according to claim 3, further comprising:

sequentially supplying voltages belonging to voltage ranges divided into a plurality of sections to each of the first to Nth potential transformers; and determining the compensation values with respect to the voltage range of each of the plurality of sections.

7. The deviation compensation method according to claim 3, wherein the compensation values are at least a transformation ratio, offset values or gain values to be applied to the first to Nth potential transformers.

8. The deviation compensation method according to claim 1, further comprising:

verifying validity of an actual voltage value for the location at which the first potential transformer is installed, the actual voltage value re-measured after resetting the deviation compensator; and outputting a signal requesting either replacement of the first potential transformer or re-determination of the compensation value when the re-measured actual voltage value is invalid.

* * * * *